(12) United States Patent
Nagao et al.

(10) Patent No.: US 6,878,612 B2
(45) Date of Patent: Apr. 12, 2005

(54) SELF-ALIGNED CONTACT PROCESS FOR SEMICONDUCTOR DEVICE

(75) Inventors: Takeshi Nagao, Miyagi (JP); Atsushi Yabata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/243,684

(22) Filed: Sep. 16, 2002

(65) Prior Publication Data

US 2004/0053490 A1 Mar. 18, 2004

(51) Int. Cl.$^7$ .......................................... H01L 21/3205
(52) U.S. Cl. ...................... 438/586; 438/634; 438/723; 438/724; 438/743; 438/744; 438/756; 438/757
(58) Field of Search .................. 438/586, 634, 438/639, 756–757, 743–744, 723–724

(56) References Cited

U.S. PATENT DOCUMENTS 6,329,292 B1 * 12/2001 Hung et al. ................ 438/706

FOREIGN PATENT DOCUMENTS

| EP | 706206 A2 | * | 4/1996 | ......... H01L/21/311 |
| JP | 03212921 A | * | 9/1991 | ......... H01L/21/02 |
| JP | 2001-284553 | | 10/2001 | |
| JP | 2001-127039 A | * | 11/2001 | |
| TW | 334623 A | * | 6/1998 | ......... H01L/23/52 |

* cited by examiner

*Primary Examiner*—George Fourson
*Assistant Examiner*—Thanh V Pham
(74) *Attorney, Agent, or Firm*—Volentine Francos & Whitt, PLLC

(57) ABSTRACT

A semiconductor device manufacturing method that assures required size of flat areas at a wiring overlay nitride film, and forms an SAC structure wherein selectivity is not lowered at corners. A first etching process wherein an insulating film is etched under conditions for forming a vertical opening (vertical conditions) is used to open up the insulating film to a point near the wiring overlay nitride film 105. A second etching process is used wherein the insulating film is opened until the wiring overlay nitride film becomes exposed, by etching under conditions assuring a high ratio of selectivity relative to the wiring overlay nitride film (SAC conditions). Then, a third etching process is used wherein the insulating film located between first and second electrodes is removed by etching under conditions with a low ratio of selectivity relative to the wiring overlay nitride film (SAC conditions).

15 Claims, 10 Drawing Sheets

7sccm

8sccm

9sccm

10sccm

FIG.9

| T (%) | R (nm) | C (%) |
|---|---|---|
| 24.4 | 4.5 | 15.6 |
| 24.4 | 2.0 | 20.2 |
| 24.4 | 1.0 | 22.4 |

300nm

200nm

100nm

SELF-ALIGNED CONTACT PROCESS FOR SEMICONDUCTOR DEVICE

BACKGROUND OF THE INVENTION

The present invention relates to a semiconductor device manufacturing method, and in particular, it relates to a semiconductor device manufacturing method characterized by a dry etching method adopted to form an SAC (Self Alignment Contact) structure.

DESCRIPTION OF THE RELATED ART

A technology referred to as SAC (Self Alignment Contact) etching has been widely employed in the area of semiconductor device manufacture in recent years. SAC etching is a technology through which contact holes are formed through self alignment by using a stopper insulating film such as a silicon nitride film that assures a high selection ratio for an oxide film. It is possible to assure the required contact area with a high ratio of reliability through SAC etching even when a misalignment or an inconsistency in the manner in which the resist is processed occurs.

An explanation is now given on the structure of contact holes formed through SAC etching.

A mask oxide film (silicon oxide film) is formed on the surface of a silicon substrate. Then, gate electrode wirings are formed by laminating gate polycide electrode wirings (poly-silicon film) and an electrode wiring overlay insulating film (silicon oxide film) on top of the mask oxide film. Next, a wiring overlay nitride film (silicon nitride film) which covers the gate electrode wirings is formed, and an insulating film (silicon oxide film) is formed to cover the top of the wiring overlay nitride film and also to fill the area between the gate electrode wirings.

Subsequently, the insulating film covering the top of the wiring overlay nitride film and filling the area between the gate electrode wirings is selectively dry etched in conditions under which the insulating film is etched with a higher ratio of selectivity relative to the wiring overlay nitride film. The etching conditions under which the dry etching process is implemented are as follows. The composition of the etching gas and the flow rates of the individual gases constituting the etching gas are; $C_4F_8$: 7 sccm, Ar: 500 sccm and $CH_2F_2$: 4 sccm. The pressure is set to 45 mT and the level of the RF power is set to 1500 W. Openings achieving an SAC structure are formed under these conditions.

However, the following problems arise with regard to the dry etching process implemented to form the SAC structure described above.

(Problem 1)

The etching conditions under which the oxide film is etched with a higher ratio of selectivity relative to the nitride film provide a significant sidewall protection effect. Namely, the surface of the side walls of the material being etched are not etched readily. During a standard dry etching process, a deposition reaction and an etching reaction both occur at a surface being etched, with the deposition reaction inhibiting the etching reaction. As the etching reaction becomes less prominent, the sidewalls take on a more gently tapered shape. When the deposition reaction is predominant, the bottom surfaces are not etched either. For these reasons, it is difficult to achieve a vertical shape under etching conditions in which the oxide film is etched with a higher ratio of selectivity relative to the nitride film.

As described above, the material is not etched readily as the deposition reaction becomes more predominant. In addition, the deposition reaction occurs with even more predominance as the etching process advances.

The etching/deposition processes are constituted of the following elementary processes;
(a) the reactive gas is absorbed at the film being etched.
(b) the reactive gas and the film being etched react with each other, and through this reaction, a product materializes.
(c) the product becomes desorbed (gasified) from the film being etched while the film is etched. If the deposition of the product from the film being etched ((c)) does not occur to a sufficient extent, the deposition becomes more predominant. If the ratio of the opening area and the etching depth (the aspect ratio) becomes large, the deposition of the product from the film being etched ((c)) becomes insufficient.

In addition, the oxide film is etched less readily as the aspect ratio increases. As a result, the oxide film is no longer etched if the opening area becomes smaller or the etching depth increases.

(Problem 2)

Under the conditions described in reference to (Problem 1), the corners of the wiring overlay nitride film are etched faster than the flat portions of the wiring overlay nitride film. In particular, if the sidewall of a hole is processed so as to contact a corner of the wiring overlay nitride film, the selectivity for the oxide film over the wiring overlay nitride film becomes lost and, as a result, the wiring overlay nitride film is etched.

The corners of the nitride film are etched faster since the process of deposition does not progress at the corners as fast as at the flat areas. The main reasons why the process of deposition does not progress at the corners as fast as at the flat areas are that the etching gas enters the corners in greater quantities compared to the flat areas and, as a result, the corners are etched from the lateral direction as well and greater quantities of ions enter the corners from a diagonal direction due to collisions of gas particles.

(Problem 3)

As the number of holes to be formed, i.e., the size of the area to be etched, increases, the selectivity for the oxide film over the nitride film becomes lowered. The selectivity for the oxide film over the nitride film is lowered when the size of the area to be etched increases since the quantity of gas originating from the product that is to contribute to the deposition reaction is smaller than the quantity of gas that is to contribute to the etching reaction (refer to the explanation (b) of the etching/deposition process given earlier).

SUMMARY OF THE INVENTION

An object of the present invention, which has been completed by addressing the problems of the semiconductor device manufacturing method in the related art discussed above is to provide a new and improved semiconductor device manufacturing method that achieves an SAC structure, in which a required size of a flat area is assured in a wiring overlay nitride film and the etching selectivity is not lowered at a corner.

In order to achieve the object described above, a semiconductor device manufacturing method that includes the following processes are provided in a first aspect of the present invention.

First, during a pre-etching process stage, a first silicon oxide film (102) is formed at a surface of a silicon substrate (101), first and second electrodes (G) each constituted of a poly-silicon film (103) and a second silicon oxide film (104) are formed by laminating the polysilicon film (103) and the second silicon oxide film (104) on top of the first silicon oxide film, a silicon nitride film (105) is formed to cover the tops and side surfaces of the first and second electrodes and a third silicon oxide film (106) is formed at an area enclosed by the first and second electrodes covered by the silicon nitride film (105) and over the top of the silicon nitride film (105).

Then, a first etching process is implemented under conditions in which a vertical opening is formed at the third silicon oxide film (vertical conditions) to open up the third silicon oxide film to a point close to the silicon nitride film (105) and a second etching process is implemented to remove the third silicon oxide film between the first and second electrodes by etching the third silicon oxide film under conditions which assures a higher ratio of selectivity for the third silicon oxide film over the silicon nitride film (SAC conditions).

In this semiconductor device manufacturing method, the third silicon oxide film is etched under conditions (vertical conditions) in which the oxide film is processed vertically to a point near the level of the silicon nitride film height and then the etching conditions are switched to those (the SAC conditions) in which a higher ratio of selectivity is assured for the oxide film over the silicon nitride film. Thus, a SAC structure in which the etching selectivity is not lowered at the corners is achieved.

In addition, in order to achieve the object, a semiconductor device manufacturing method that includes the following processes is provided in a second aspect of the present invention.

First, during a pre-etching process stage, a first silicon oxide film (102) is formed at a surface of a silicon substrate (101), first and second electrodes (G) each constituted of a poly-silicon film (103) and a second silicon oxide film (104) are formed by laminating the polysilicon film (103) and the second silicon oxide film (104) on top of the first silicon oxide film, a silicon nitride film (105) is formed to cover the tops and side surfaces of the first and second electrodes and a third silicon oxide film (106) is formed at an area enclosed by the first and second electrodes covered by the silicon nitride film (105) and over the top of the silicon nitride film (105).

Then, a first etching process is implemented under conditions in which a vertical opening is formed at the third silicon oxide film (vertical conditions) to open up the third silicon oxide film to a point close to the silicon nitride film (105), a second etching process is implemented to open up the third silicon oxide film until of the silicon nitride film (105) becomes exposed by etching the third silicon oxide film under conditions in which a higher ratio of selectivity is achieved for the third silicon oxide film over the silicon nitride film (SAC conditions (1)) and a third etching process is implemented to remove the third silicon oxide film present between the first and second electrodes by etching the third silicon oxide film under conditions in which its selectivity relative to that of the silicon nitride film is low (SAC conditions 2)).

In this semiconductor device manufacturing method, the etching process implemented under the SAC conditions in the first aspect is executed under two separate sets of SAC conditions (1) and (2). Namely, the etching process is implemented under the conditions (SAC conditions (1)) with a higher ratio of selectivity relative to the silicon nitride film until the silicon nitride film becomes exposed and then the etching process is implemented under the conditions (SAC conditions (2)) with a lower ratio of selectivity relative to the silicon nitride film when removing the third silicon oxide film between the first and second electrodes. This assures an even larger size of flat area at the silicon nitride film compared to that obtained under the SAC conditions in the first aspect, and, as a result, an SAC structure in which the etching selectivity is not lowered at the corners is achieved.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIG. 9 shows the relationship among the contact hole opening rate C, the resist removal width R at the peripheral area of the silicon substrate 101 and the total opening area rate T on the silicon substrate 101.

DETAILED DESCRIPTION OF THE PREFERRED EMBODIMENTS

Figure 1:
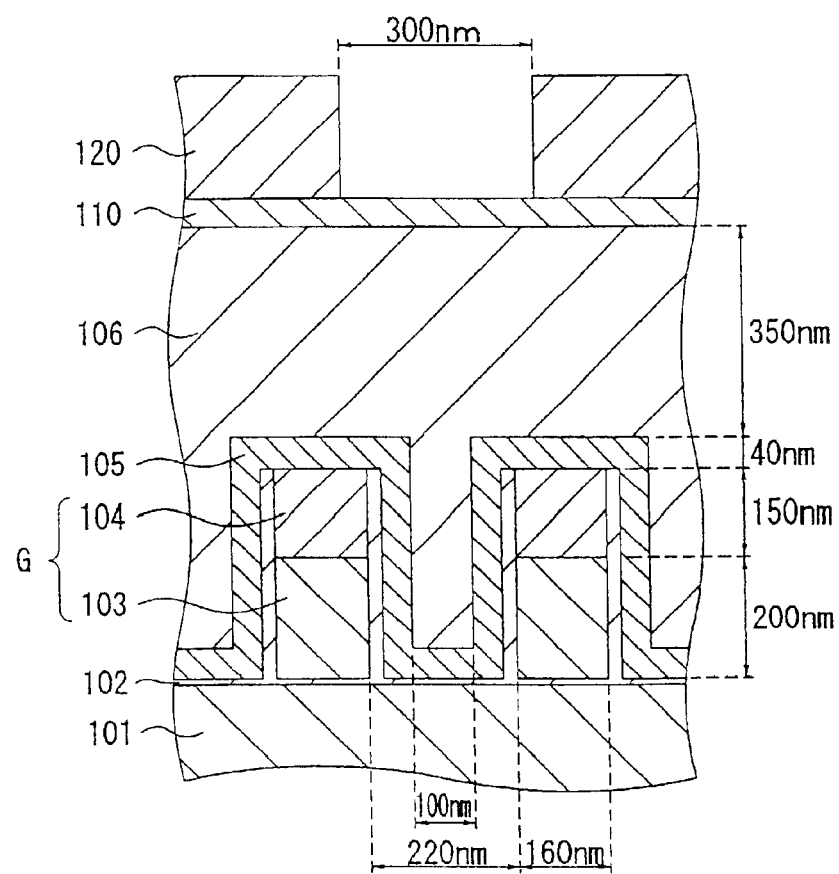
FIG. 1 illustrates the film structure assumed at the pre-SAC structure formation stage.

The following is a detailed explanation of the preferred embodiments of the semiconductor device manufacturing method according to the present invention, given in reference to the attached drawings. It is to be noted that in the specification and the drawings, the same reference numerals are assigned to components having substantially identical functions and structural features to preclude the necessity for a repeated explanation thereof.

(First Embodiment)

The film structure assumed at the pre-SAC structure formation stage is now explained in reference to FIG. 1.

An insulating film (a first silicon oxide film) 102 is formed over a thickness of approximately 9 nm on a silicon substrate 101. On top of the insulating film 102, gate electrode wirings G are formed by laminating gate polycide electrode wirings (a poly-silicon film) 103 and an electrode overlay wiring insulating film (second silicon oxide film) 104. The width of each gate electrode wiring G is approximately 160 nm and the distance between adjacent gate electrode wirings G is approximately 220 nm. The insulating film 102 is also formed at sidewalls of the gate electrode wirings G over a thickness of approximately 20 nm.

In addition, a wiring overlay nitride film (silicon nitride film) 105 is formed to cover the gate electrode wirings G. It is formed on top of the electrode overlay wiring insulating film 104 over a thickness of approximately 40 nm. The wiring overlay nitride film 105 is also deposited at the side walls of the gate electrode wirings G over a thickness of approximately 40 nm. Thus, the distance between the gate electrode wirings G covered by the wiring overlay nitride film 105 is approximately 100 nm.

An insulating film 106 is formed to cover the top of the wiring overlay nitride film 105 and to fill the area between the gate electrode wirings G. The film thickness of the insulating film 106 is approximately 350 nm at the top of the wiring overlay nitride film 105.

FIG. 1 shows an organic reflection-preventing film (BARC) 110 and a mask pattern 120 to be used during the etching process which is to be detailed later. In the embodiment, the diameter of the openings formed at the insulating film 106 through the etching process is approximately 380 nm. This value represents the upper limit at which adjacent contact holes do not become continuous to each other. The diameter of the openings at the mask pattern 120 is adjusted in conformance to the diameter of the openings at the insulating film 106, and it is set to approximately 300 nm in the mask pattern 120 constituted of a photoresist. As explained later, etching conditions under which the resist is allowed to recede are adopted in the embodiment. Thus, the diameter of the openings at the insulating film 106 formed through the etching process, which is implemented by using the mask pattern 120 having openings with a diameter of approximately 300 nm, is approximately 380 nm.

Next, the method of SAC structure formation is explained.

In the embodiment, an etching process under conditions (a) in which vertical openings are formed at the insulating film 106 (vertical conditions) and an etching process under conditions (b) in which a high ratio of selectivity is assured for the insulating film over the wiring overlay nitride film 105 (SAC conditions) are sequentially executed.

Vertical condition is that the etching reaction is more predominant than the deposition reaction. Through this condition, openings (contact holes) are formed approximately vertical shape in section. SAC condition is that the deposition reaction is more predominant than the etching reaction. Through this condition, the surface of the substrate is exposed without removing a nitride film (a protective film) on the gate electrode wiring.

The embodiment has been conceived from the following perspective.

If conditions under which a high selection ratio is achieved relative to the nitride film are selected to process the insulating film 106 at the top of the wiring overlay nitride film 105, the insulating film 106 takes on a gentle tapered shape and, as a result, flat portions cannot be informed of over a sufficiently large area at the wiring overlay nitride film 105. If, on the other hand, conditions under which the insulating film 106 does not assume and gently tapered shape (vertical conditions) are selected to process the insulating film 106 at the top of the wiring overlay nitride film 105, the wiring overlay nitride film 105 becomes etched to a great extent since the selection ratio for the nitride film is normally low under such vertical conditions. Accordingly, an etching process is first implemented under vertical conditions (a) to open up the insulating film 106 to a point close to the wiring overlay nitride film 105 in the embodiment.

Then, an etching process is implemented under SAC conditions (b) to remove the insulating film 106 present between the gate electrode wirings G.

These etching processes are now explained in the order in which they are implemented.

(a) Etching Process Implemented Under Vertical Conditions

The organic reflection-preventing film 110 is dry etched by using the mask pattern 120 having openings with a diameter of approximately 300 nm and then the insulating film 106 is dry etched down to a depth of approximately 200 nm under the following conditions.

The etching conditions are selected as follows.

The composition of the processing gas and in the flow rates of the individual gases constituting the processing gas are; $CF_4$: 60 sccm, Ar: 160 sccm and $O_2$: 60 sccm. The pressure is set to 60 mT, the level of the power is set to 1500 W and the temperature of the lower electrode at the etching processing apparatus is set to 50° C. It is to be noted that any type of etching processing apparatus may be utilized as long as it is suited to implement a dry etching process under the etching conditions described above. Since details of such an etching processing apparatus not bear any relevance to the substance of the present invention, their explanation is omitted. It is to be noted that the numerical values provided in reference to the etching conditions are all approximate figures.

Figure 2:
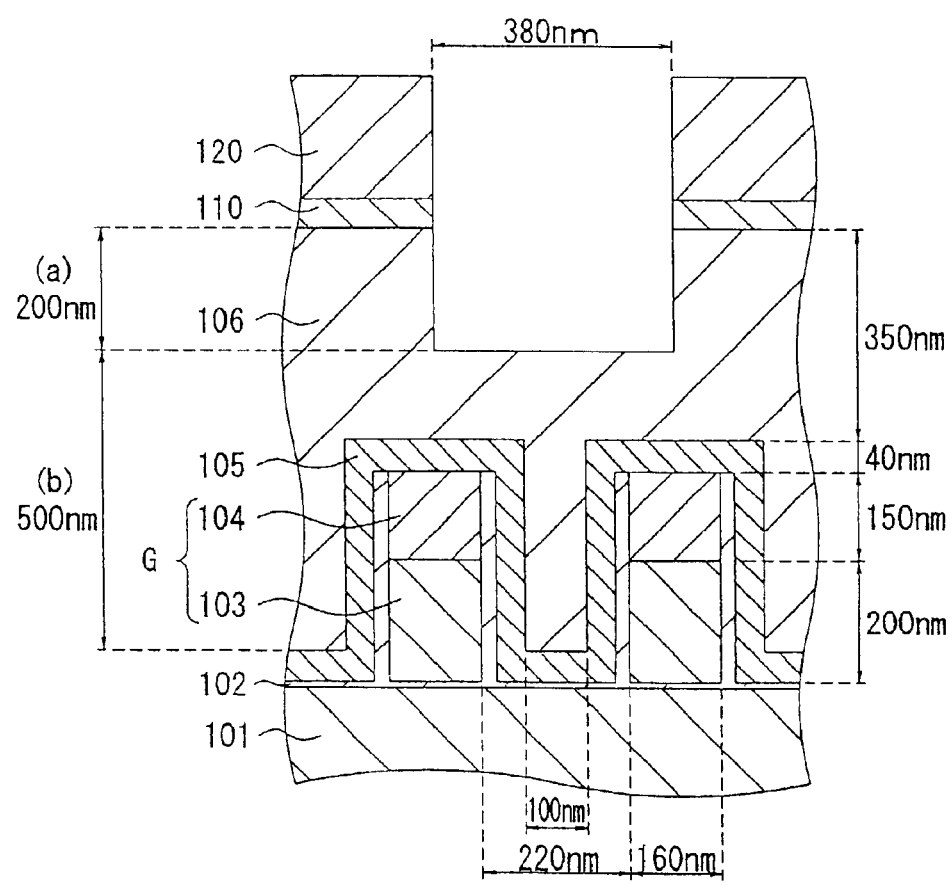
FIG. 2 illustrates the method of SAC structure formation achieved in a first embodiment.

Under the etching conditions described above, an almost vertical etching shape as shown in FIG. 2 is achieved. In addition, the resist is allowed to recede under these etching conditions. Thus, the diameter of the openings at the mask pattern 120, which is approximately 300 nm prior to the etching process, is increased to approximately 380 nm through the etching process. As a result, the diameter of the openings at the insulating film 106 is approximately 380 nm.

(b) Etching Process Implemented Under SAC Conditions

Figure 3:
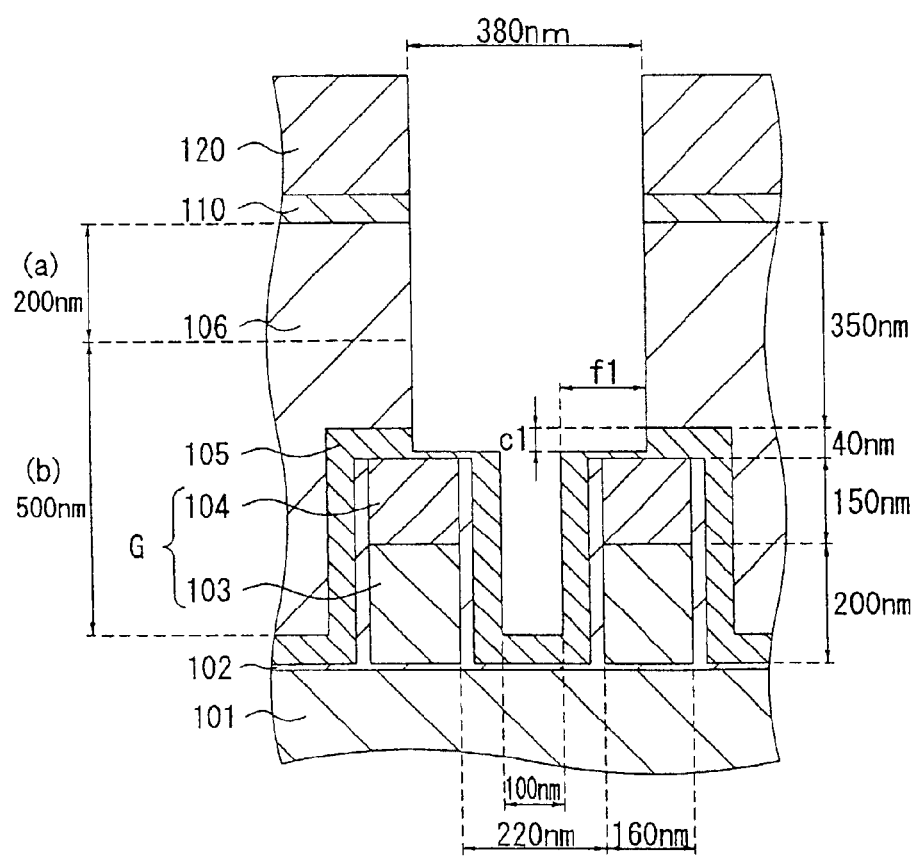
FIG. 3 illustrates the method of SAC structure formation achieved in the first embodiment.

Next, the insulating film 106 is selectively dry etched over the wiring overlay nitride film 105 by switching the etching conditions. The insulating film 106 is dry etched down to a depth point matching the bottom surface of the wiring overlay nitride film 105 at the area between the gate electrode wirings G. As shown in FIG. 3, the insulating film 106 is etched over approximately 500 nm under the SAC conditions, and the depth of etching measured from the top surface of the insulating film 106 is approximately 700 nm.

The etching conditions for this process are selected as follows.

The composition of the processing gas and the flow rates of the individual gases constituting the processing gas are; $C_4F_8$: 8 sccm, Ar: 500 sccm and $CH_2F_2$: 4 sccm. The pressure is set to 45 mT and the level of the power is set to 1500 W. It is to be noted that the same etching processing apparatus as that utilized in the etching process implemented under the vertical conditions (a) may be employed for this process as well. The flow rate of $C_4F_8$ does not need to be exactly 8 sccm, but the ideal flow rate range for $C_4F_8$ is approximately 7~10 sccm.

Under the etching conditions described above, the insulating film 106 is removed down to the level of the bottom surfaces of the wiring overlay nitride film 105 present over the area between the gate electrode wirings G. During this process, the wiring overlay nitride film 105 is ground over approximately; c1=30 nm, and a selection ratio of 18 is achieved for the oxide film relative to the nitride film. The wiring overlay nitride film 105 on the gate electrode wirings G is exposed by f1=50 nm or more (f1=140 nm in FIG. 3) from the wiring ends (corners).

(Test Results 1)

Figure 4A:
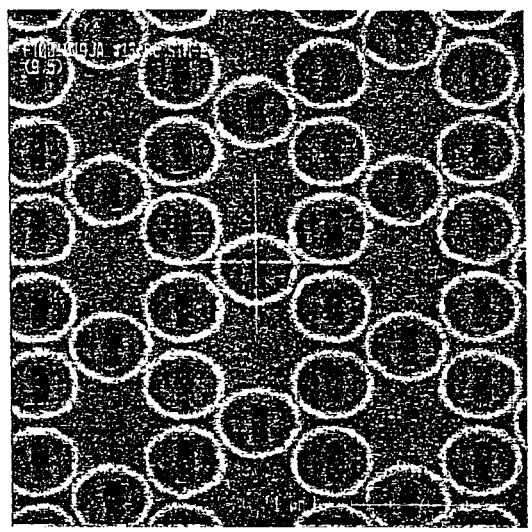
FIGS. 4(a) and 4(B) illustrate the state shown in FIG. 3, viewed from above.
Figure 4B:
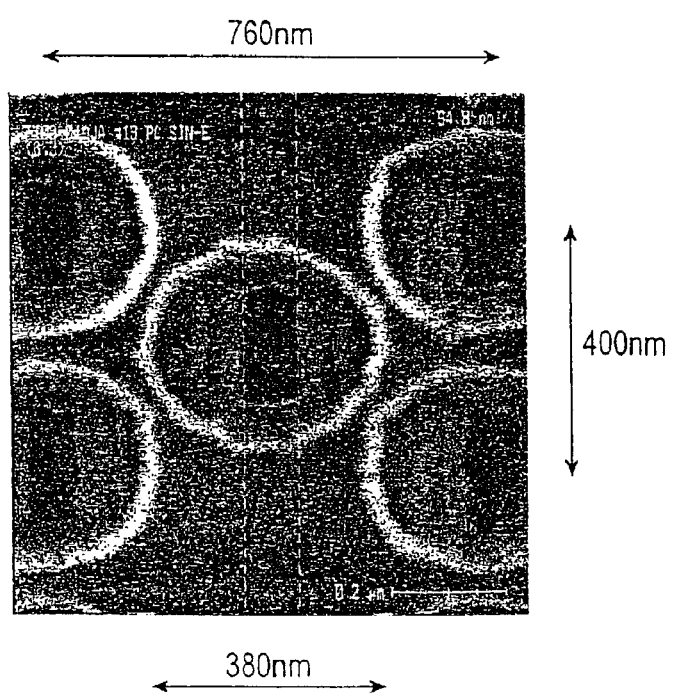
Figure 5A:
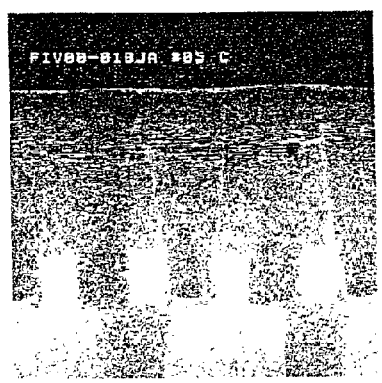
FIGS. 5(a)–5(d) show varying relationships between the $C_4F_8$ flow rate and the etching shape.
Figure 5B:
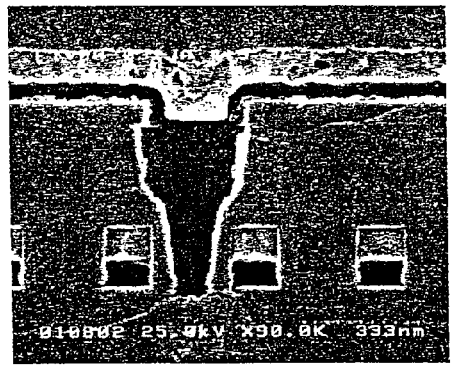
Figure 5C:
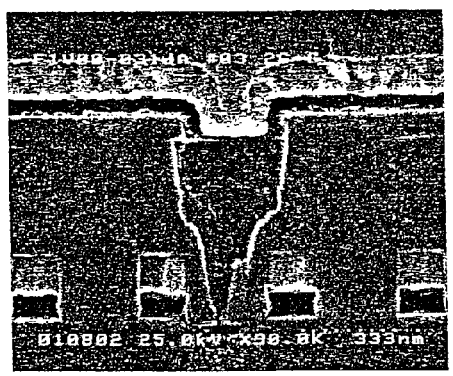
Figure 5D:
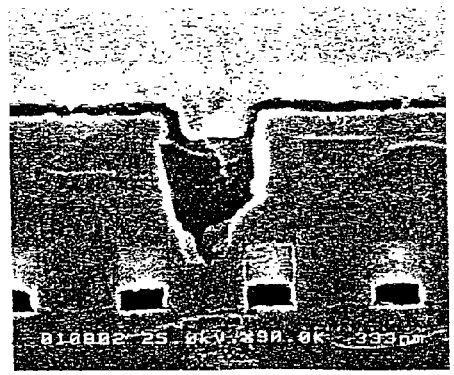

FIG. 4 presents a photograph of the state shown in FIG. 3, viewed from above. FIG. 4(b) is a partial enlargement of FIG. 4(a). As shown in FIG. 4, the opening diameter of 380 nm represents the upper limit at which contact between adjacent contact holes can be avoided.

(Test Results 2)

FIG. 5 shows varying relationships between the flow rate of $C_4F_8$ and the etching shape.

(a) 7 sccm

While the wiring overlay nitride film 105 is not removed, the etching process advances almost to the point at which the corners of the wiring overlay nitride film 105 are removed. The phenomenon in which the wiring overlay nitride film 105 becomes removed at the corners is referred to as an SAC break.

(b) 8 sccm

No SAC break occurs and grooves formed through etching reach the insulating film constituting the bottom surfaces of the gate electrode wirings. This is the most desirable etching shape.

(c) 9 sccm

An etch stop is induced just before the grooves formed through etching reach the silicon oxide film constituting the bottom surfaces of the gate electrode wirings.

(d) 10 sccm

An etch stop is induced well before the grooves formed through etching reach the silicon oxide film constituting the bottom surfaces of the gate electrode wirings.

As shown in FIG. 5, the allowable range for the $C_4F_8$ flow rate is 7 sccm~10 sccm and in particular, 8 it is ideal to set the $C_4F_8$ flow rate to 8 sccm.

The test results are applicable in conjunction with an opening rate of 20~26% at the silicon substrate 101 with an 8-inch diameter. The opening rate at the silicon substrate 101 in this context refers to the rate of the total of the hole areas relative to the entire area of the silicon substrate 101 (assuming that there is no opening formed through peripheral exposure).

Opening rate (%)=π×(hole diameter/2)$^2$×number of holes/area of silicon substrate 101.

If the opening rate at the wafer is lower than 20%, the allowable range for the $C_4F_8$ flow rate becomes lower than 7~10 sccm. If, on the other hand, the opening rate at the wafer is higher than 26%, the allowable range for the $C_4F_8$ flow rate becomes higher than 7~10 sccm.

(Advantages of the First Embodiment)

As explained above, in the embodiment, the insulating film 106 is etched first under conditions (vertical conditions) in which the insulating film 106 is processed vertically down to a point close to the level of the height of the wiring overlay nitride film 105 and then the etching conditions are switched to oxide film etching conditions (SAC conditions) with a high ratio of selectivity assured over the insulating film over the wiring overlay nitride film 105. As a result, an SAC structure which assures a sufficient size of flat areas formed at the wiring overlay nitride film 105 and does not lower the etching selectivity at the corners is achieved. In the device size achieved through the embodiment, the flat portions at the wiring overlay nitride film 105 can be formed over at least 50 nm as shown in FIG. 3.

In addition, while a cleaning process may need to be implemented to clean the etching processing chamber when switching from the vertical conditions to the SAC conditions, openings can be formed with an even higher ratio of accuracy by implementing the cleaning process.

Furthermore, depending upon the processing conditions that are selected, the process for cleaning the processing chamber may be omitted so as to continuously implement the etching processes.

(Second Embodiment)

Figure 6:
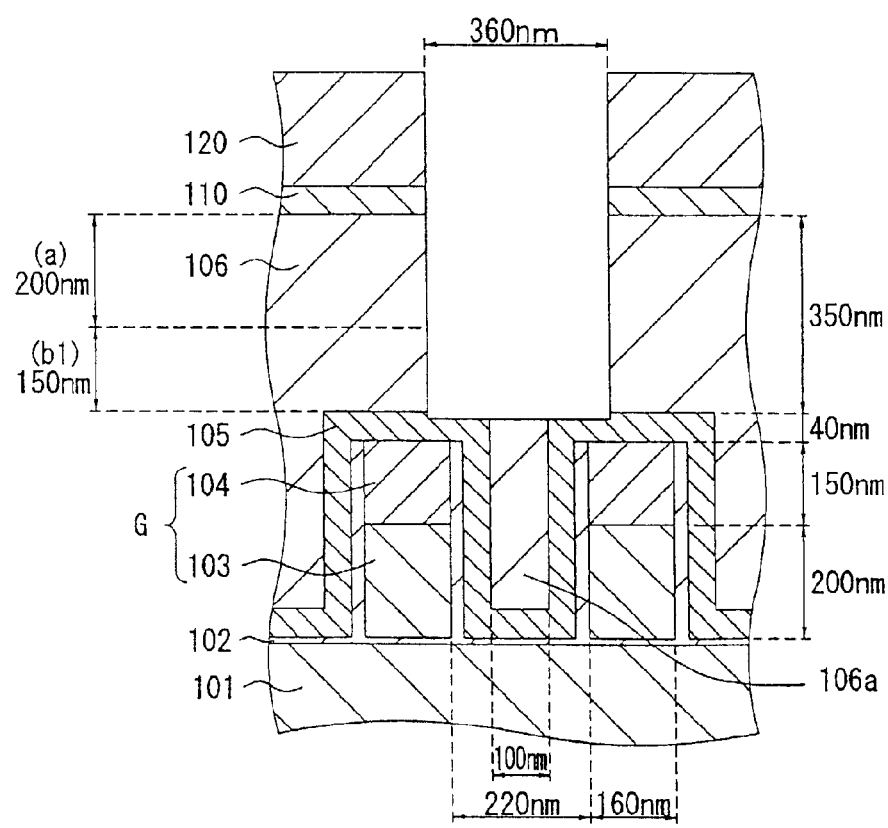
FIG. 6 illustrates the method of SAC structure formation achieved in a second embodiment.
Figure 7:
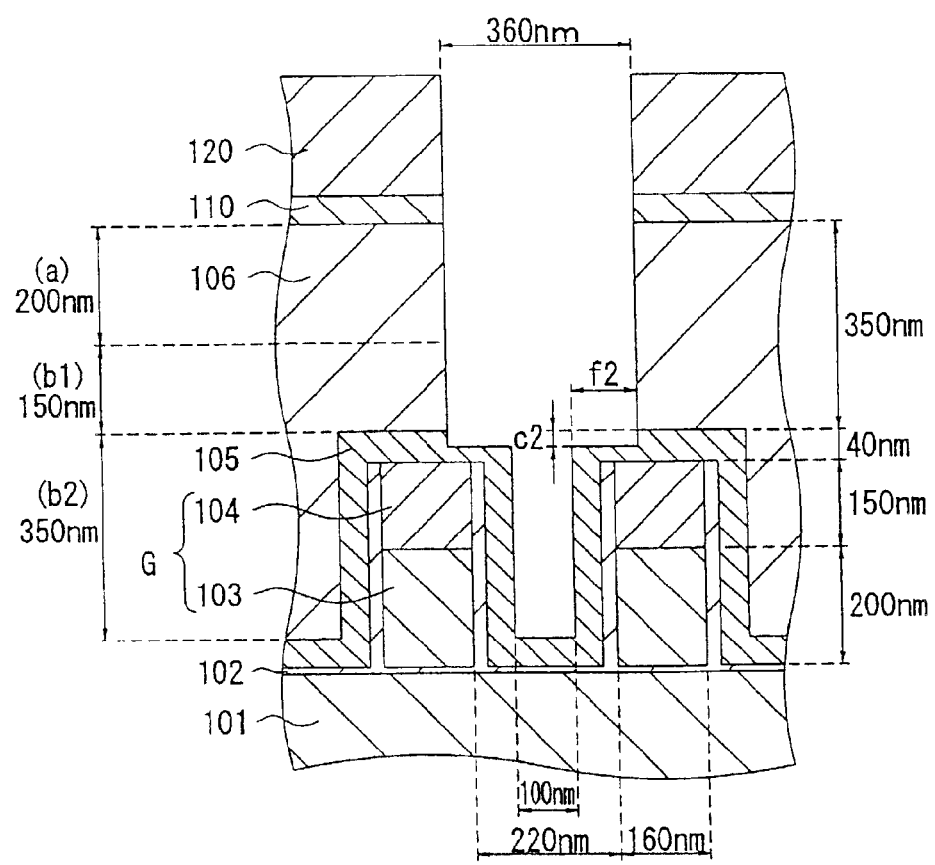
FIG. 7 illustrates the method of SAC structure formation achieved in the second embodiment.

The semiconductor device manufacturing method achieved in the second embodiment is now explained in reference to FIGS. 6 and 7.

The film structure assumed at the pre-SAC structure formation stage is similar to that shown in FIG. 1.

In the first embodiment, the etching process starting at a depth point of approximately 200 nm measured from the top surface of the insulating film 106 and ending at a depth point of approximately 700 nm, at which the entire etching process is completed, is implemented under SAC conditions (b). During this process, as the wiring overlay nitride film 106 become exposed, the width of the openings at the insulating film 106 is reduced from approximately 380 nm to approximately 100 nm. When this happens, the etching rate of the insulating film 106 become lowered or the etching process itself may be stopped depending upon the specific etching conditions that are adopted. The conditions in which the etching rate of the insulating film 106 become lower or the etching process stops are those with which a higher $C_4F_8$ flow rate or a lower $O_2$. While the flow rate for $C_4F_8$ is set to 8 sccm under SAC conditions (b) in the first embodiment, the etching rate of the insulating film 106 may become lower or the etching process may stop if the flow rate of $C_4F_8$ is set higher than 8 sccm.

Accordingly, in this embodiment, the etching process is first implemented under vertical conditions (a) to open up the insulating film 106 to points near the wiring overlay nitride film 105 as in the first embodiment. Next, the etching process is implemented under the SAC conditions (b) over the following two stages.

(b1) An etching process is implemented under SAC conditions that achieve a high selection ratio for the nitride film following the end of the etching process implemented under the vertical conditions until the wiring overlay nitride film 105 becomes exposed (between etching depth points of 200 nm and 350 nm).

(b2) An etching process is then implemented under SAC conditions with a Lower selection ratio for the nitride film after the wiring overlay nitride film 105 becomes exposed until the etching process is completed (between etching points of 350 nm and 700 nm).

The individual etching processes are now explained in the order that they are implemented.

(a) Etching Process Implemented Under Vertical Conditions

The process is implemented under conditions similar to those selected in the first embodiment. The process is not explained repeatedly. Under these etching conditions, an almost vertical etching shape is achieved as shown in FIG. 2.

(b1) Etching Process Implemented Under SAC Conditions with High Selection Ratio for Nitride Film Next, the insulating film 106 is dry etched under different etching conditions.

The insulating film 106 is dry etched to a depth point near the upper surface of the wiring overlay nitride film 105 on the gate electrode wirings G. As shown in FIG. 6, the insulating film 106 is etched under the SAC conditions (b1) with a high selection ratio for the nitride film over approximately 150 nm to an etching depth point of approximately 350 nm measured from the top surface of the insulating film 106.

The etching conditions for this process are selected as follows.

The composition of the processing gas and in the flow rates of the individual gases constituting the processing gas are; $C_4F_8$: 10 sccm Ar: 500 sccm and $CH_2F_2$: 4 sccm. The pressure is set to 45 mT and the level of the power is set to 1500W. These etching conditions differ from the SAC conditions (b) adopted in the first embodiment in that the $C_4F_8$ gas flow rate is set to 10 sccm instead of 8 sccm. It is to be noted that the same etching processing apparatus as that utilized in the etching process implemented under the vertical conditions (a) may be employed for this process as well.

As shown in FIG. 6, the etching process on an insulating films 106a over the area enclosed by the wiring overlay nitride film 105 and the gate electrode wirings G does not progress up to this point. The reason is now explained.

The explanation is now given on the selection ratio for the nitride film from the perspective of the balance between CFx supplied from the processing gas and the oxygen gas.

CFx, which etches the insulating film (the oxide film or the nitride film) and silicon, also deposits a CxFy polymer and a carbon polymer (deposition reaction). A high selection ratio for the nitride film is equivalent to a robust deposition reaction. As the quantity of $C_4F_8$ increases, $CF_2$ also increases.

The following is an explanation given by focusing on $CF_2$ which is considered to strongly affect the deposition reaction among various CFx (x=1, 2, 3, . . . ). While $CF_2$ induces a competing state between the etching reaction and the deposition reaction, it uses up the deposition if an oxygen gas is present. Oxygen is supplied as the oxygen gas and also some oxygen is generated while an oxide film ($SiO_2$) is etched. The balance between $CF_2$ and oxygen determines the selection ratio for the nitride film.

For the reason described above, the etching process on the insulating film 106a over the area enclosed by the wiring overlay nitride film 105 and the gate electrode wirings G does not progress in this state. Thus, the insulating film 106 is removed down to a depth point close to the upper surface of the wiring overlay nitride film 105 as shown in FIG. 6 under the etching conditions described above.

(b2) Etching Process Implemented Under SAC Conditions with a Low of Selection Ratio for Nitride Film Subsequently, the insulating film 106 is continuously dry etched under different etching conditions. The insulating film 106a over the area between the gate electrode wirings G is removed and thus, the insulating film 106 is dry etched to a depth point at the bottom surfaces of the wiring overlay nitride film 105 located between the gate electrode wirings G. The insulating film 106 is etched over approximately 350 nm as shown in FIG. 7 under the SAC conditions (b2) with a low selection ratio for the nitride film, achieving an overall etching depth of approximately 700 nm measured from the top surface of the insulating film 106.

The etching conditions for this process are selected as follows.

The composition of the processing gas and the flow rates of the individual gases constituting the processing gas are; $C_4F_8$: 8 sccm Ar: 500 sccm and $CH_2F_2$: 4 sccm. The pressure is set to 45 mT and the level of the power is set to 1500 W. These etching conditions differ from the SAC conditions (b1) (with a high selection ratio relative to the nitride film) in that the gas flow rate of $C_4F_8$ is reduced to approximately 8 sccm or lower from approximately 10 sccm. The $C_4F_8$ gas flow rate should be set to approximately 7~8 sccm for this process, and it is particularly desirable to set the $C_4F_8$ gas flow rate to approximately 8 sccm. It is to be noted that the same etching processing apparatus as that utilized in the etching process implemented under the SAC conditions (b1) with a high selection ratio for the nitride film may be employed for this process as well.

Under the etching conditions described above, the insulating film 106 is removed to a depth point matching the bottom surface of the wiring overlay nitride film 105 present between the gate electrode wirings G as shown in FIG. 7. During this process, the wiring overlay nitride film 105 is ground over approximately; c2=20 nm. The wiring overlay nitride film 105 on the gate electrode wirings G is exposed from the wiring ends (corners) by approximately; f2=60 nm or more. Thus, an SAC structure with even better selectivity relative to the nitride film compared to the first embodiment is achieved.

As described above, the process implemented under the SAC conditions (b) after the process implemented under the vertical conditions (a) includes two separate processes in the embodiment. Namely, process is implemented under the SAC conditions (b1) with a high selection ratio for the nitride film in which the insulating film 106a located between the gate electrode wirings G is not etched, down to a point close to the wiring overlay nitride film 105, and then, a process is implemented under the SAC conditions (b2) with a low selection ratio for the nitride film in which the insulating film 106a located between the gate electrode wirings G is etched. Thus, a larger quantity of the wiring overlay nitride film 105 can be left unetched compared to the first embodiment. At the device size achieved in the embodiment, the size of the flat portions formed at the wiring overlay nitride film 105 is increased by approximately 10 nm compared to that achieved in the first embodiment.

(Third Embodiment)

Figure 8A:
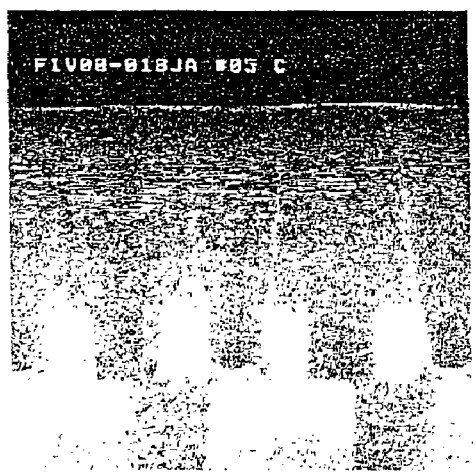
FIGS. 8(a)–8(c) show varying relationships between the etching area and the etching shape (the selection ratio for the nitride film)
Figure 8B:
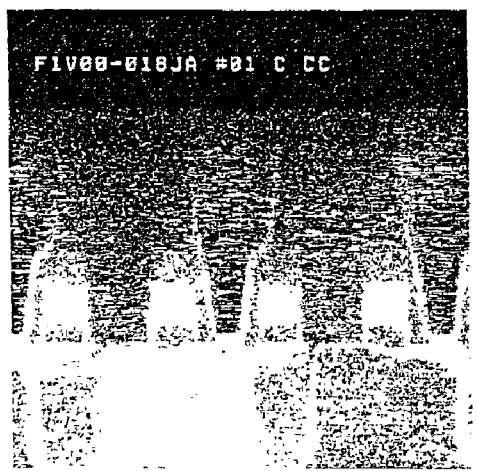
Figure 8C:

An explanation is given in reference to this embodiment which is achieved as an example of application of the first and second embodiments by focusing on the relationship between the etching area and the etching shape (the selection ratio for the silicon nitride film). FIG. 8 shows varying relationships between the etching area and the etching shape (the selection ratio for the nitride film), with FIG. 8(a) showing the relationship achieved through a full-shot exposure, FIG. 8(b) showing the relationship achieved through a ½-shot exposure and FIG. 8(c) showing the relationship achieved through a ¼-shot exposure.

(a) Full-shot Exposure

The selection ratio for the nitride film is lowered and the etching process progresses to a point just before the wiring overlay nitride film 105 becomes removed through etching. An area where the etching process has advanced to this state is referred to as a SAC break.

(b) ½-Shot Exposure

The selection ratio for the nitride film improves and no SAC breaks occur.

(c) ¼-Shot Exposure

The selection ratio for the nitride film improves and no SAC breaks occur.

As shown in FIG. 8, the selection ratio for the silicon nitride film becomes lower as the etching area increases.

In order to prevent a reduction in the selectivity for the oxide film over the nitride film from occurring as the opening area increases, the etching shape is normally optimized by controlling the flow rate of $C_4F_8$. However, in the first and second embodiments, the selectivity relative to the nitride film and, in particular, the selectivity at the wiring corners are not lowered by adopting a specific combination of etching conditions. For this reason, it is desirable that different numbers of contact holes can be formed without having to change the etching conditions. In other words, it is desirable to be able to execute etching processes implemented to achieve varying opening areas under a single set of etching conditions.

Accordingly, by removing the resist at the peripheral area of the silicon substrate 101 before the formation of the SAC structure and adjusting the total opening area rate T on the silicon substrate 101 at a specific level or within a specific range, identical SAC structures can be formed even when the number of contact holes that are formed changes (even when the opening of area of the contact holes changes).

Figure 9:
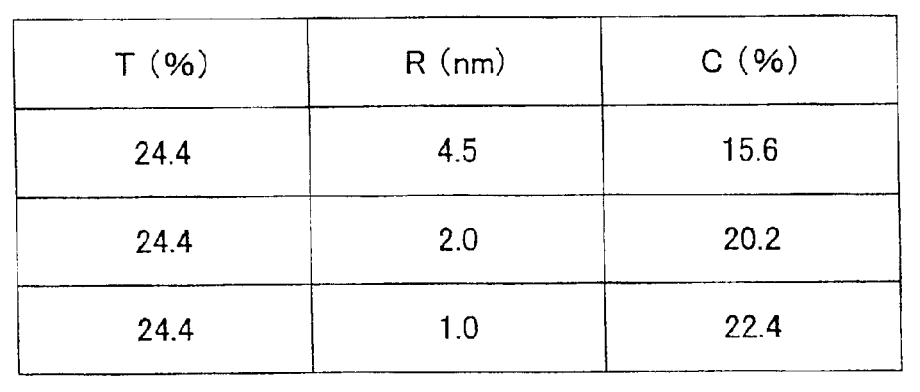

FIG. 9 shows the relationship among the opening rate C of the contact holes, the width R over which the resist is removed at the peripheral area of the silicon substrate 101 and the total opening area rate T on the silicon substrate 101. In this example, the bore diameter of the contact holes is 360 nm.

As shown in FIG. 9, the width R over which the resist is removed at the peripheral area of the silicon substrate 101 is increased if the opening rate C of the contact holes in the silicon substrate 101 is low. In contrast, if the opening rate C of the contact holes on the silicon substrate 101 prior to the processes in this manner is high, the width R over which the resist is removed at the peripheral area of the silicon substrate 101 is reduced. By removing the resist at the peripheral area of the silicon substrate 101, the sum of the opening area at the insulating film 106 and the area over which the resist is removed at the peripheral area of the silicon substrate 101 can be kept at a constant value. By executing the process in this manner, the total opening area rate T on the silicon substrate 101 can be kept at a constant level (T=24.4 (%) in the example presented in FIG. 9) even when the opening rate C of the contact holes on the silicon substrate 101 changes and, as a result, identical SAC structures can be achieved without having to change the SAC conditions.

While the invention has been particularly shown and described with respect to preferred embodiments of the semiconductor device manufacturing method according to the present invention by referring to the attached drawings, the present invention is not limited to these examples and it will be understood by those skilled in the art that various changes in form and detail may be made therein without departing from the spirit, scope and teaching of the invention.

For instance, while the etching conditions are switched from the vertical conditions (a) to the SAC conditions (b) at an etching depth point of approximately 200 nm in the first embodiment, the present invention is not limited to this example and the etching conditions may be switched within an etching depth point range of approximately 100~300 nm.

Figure 10A:
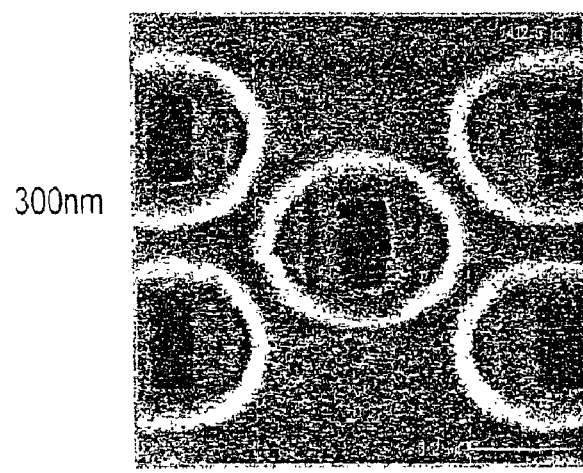
FIGS. 10(a)–10(c) show variance in timing with which the etching conditions are switched from vertical conditions (a) to the (b) SAC conditions.
Figure 10B:
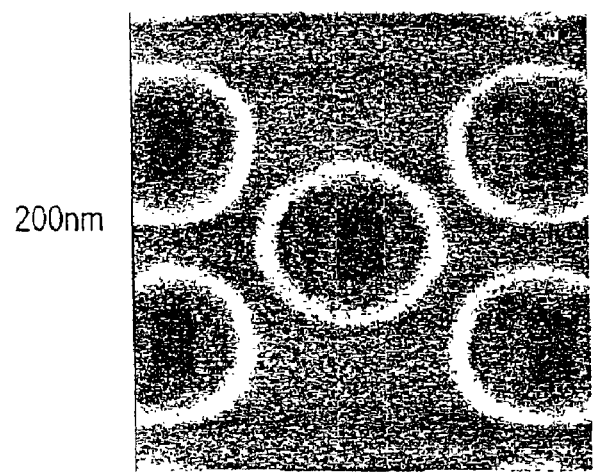
Figure 10C:
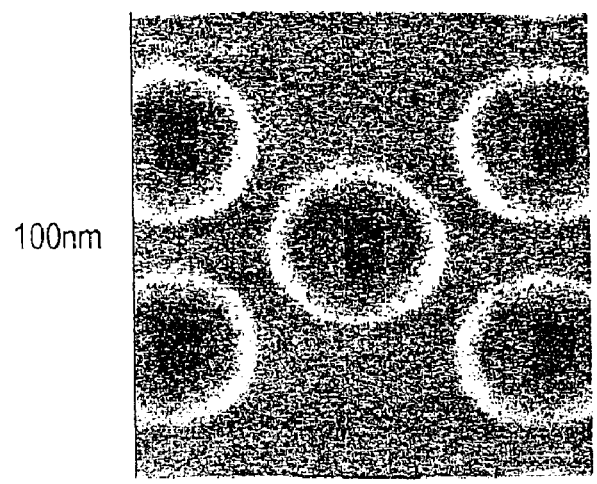

The timing with which the etching conditions are switched from the vertical conditions (a) to the SAC conditions (b) is now explained in reference to FIG. 10. In the embodiment, the etching conditions are switched from the vertical conditions (a) to the SAC conditions (b) when the insulating film 106 has been etched to a depth of 200 nm. FIG. 10 shows varying widths of the flat areas on the wiring overlay nitride film 105 achieved by varying the switching timing, i.e., by switching the etching conditions at etching depth points of 100, 200 and 300 nm at the insulating film 106.

As shown in FIG. 10, as the etching conditions are switched from the vertical conditions (a) to the SAC conditions (b) at a larger etching depth point at the insulating film 106, the width of the flat areas at the wiring overlay nitride film 105 increases.

As explained above, the oxide film is etched under conditions in which the oxide film is processed vertically (under vertical conditions) to a point close to the height of the wiring overlay nitride film and then the etching conditions are switched to those (the SAC conditions) under which the oxide film is etched with a higher ratio of selectivity relative to the wiring overlay nitride film. As a result, a sufficient size of flat areas can be formed at the wiring overlay nitride film which enables formation of an SAC structure in which the selectivity at the corners is not lowered.

In the first and second embodiment, the etching conditions from the vertical condition is switched within the etching depth point range of approximately 100~300 nm. But the etching depth of switching condition is not limited to 100~300 nm. The etching depth of switching condition is prefer deep without exposing the top of a nitride film is not exposed.

In addition, the etching process executed under SAC conditions is implemented under two different sets of SAC conditions (1) and (2), according to the present invention. Namely, the etching process is implemented under conditions (the SAC conditions (1)) in which a high ratio of selectivity relative to the silicon nitride film is assured until the silicon nitride film becomes exposed and then the etching process is implemented under conditions (the SAC conditions (2)) with a low ratio of selectivity relative to the silicon nitride film when removing the third silicon oxide film located between the first and second electrodes. As a result, an even greater size of flat areas can be formed at the wiring overlay nitride film which allows formation of an SAC structure in which the selectivity at the corners is not lowered.

What is claimed is:

1. A method for manufacturing a self alignment contact in a semiconductor device including
   a first silicon oxide film formed at a surface of a silicon substrate,
   a poly-silicon film and a second silicon oxide film laminated on top of said first silicon oxide film, thereby forming a first electrode and a second electrode each constituted of said poly-silicon film and said second silicon oxide film,
   a silicon nitride film formed to cover top and side surfaces of said first electrode and said second electrode, and
   a third silicon oxide film formed in an area between said first electrode and said second electrode that are covered with said silicon nitride film, and over a top of said silicon nitride film formed on said first electrode and on said second electrode, the method comprising:
   a first etching process in which said third silicon oxide film is etched to open up said third silicon oxide film above the top of said silicon nitride film, wherein said first etching process uses a first etching gas mixture including $CF_4$, argon and $O_2$; and
   a second etching process in which said third silicon oxide film between said first electrode and said second electrode is removed by etching said third silicon oxide film, wherein said second etching process uses a second etching gas mixture that is different than the first etching gas mixture and that does not contain oxygen,
   wherein a sum of an opening area at said third silicon oxide film and an area over which a resist is removed from a peripheral area of said silicon substrate is kept at a constant value by removing the resist at the peripheral area of said silicon substrate prior to the first etching process.

2. The method for manufacturing a self alignment contact in a semiconductor device according to claim 1, wherein flow rates of components of the first etching gas mixture during said first etching process are $CF_4$: 60 sccm, Ar: 160 sccm and $O_2$: 60 sccm.

3. The method for manufacturing a self alignment contact in a semiconductor device according to claim 1, wherein said third silicon oxide film is over etched by approximately 15% relative to a desired etching depth to be achieved through said second etching process.

4. The method for manufacturing a self alignment contact in a semiconductor device according to claim 1, wherein the second etching gas mixture includes $C_4F_8$, argon and $CH_2F_2$.

5. The method for manufacturing a self alignment contact in a semiconductor device according to claim 4, wherein flow rates of components of the second etching gas mixture during said second etching process are $C_4F_8$: 7~10 sccm, Ar: 500 sccm and $CH_2F_2$: 4 sccm.

6. The method for manufacturing a self alignment contact in a semiconductor device according to claim 1, wherein a distance between said first electrode and said second electrode is 220 nm.

7. A method for manufacturing a self alignment contact in a semiconductor device including
a first silicon oxide film formed at a surface of a silicon substrate,
a poly-silicon film and a second silicon oxide film laminated on top of said first silicon oxide film thereby forming a first electrode and a second electrode each constituted of said poly-silicon film and said second silicon oxide film,
a silicon nitride film formed to cover top and side surfaces of said first electrode and said second electrode, and
a third silicon oxide film formed in an area between said first electrode and said second electrode that are covered with said silicon nitride film, and over a top of said silicon nitride film formed on said first electrode and formed on said second electrode, the method comprising:
a first etching process in which said third silicon oxide film is etched to open up said third silicon oxide without a top said silicon nitride film being etched, wherein said first etching process uses a first etching gas mixture that includes $CF_4$, argon and $O_2$;
a second etching process in which said third silicon oxide film formed over said first electrode and said second electrode is removed by etching to expose said silicon nitride film, wherein said second etching process uses a second etching gas mixture that is different than the first etching gas mixture and that does not contain oxygen; and
a third etching process in which said third silicon oxide film located between said first electrode and said second electrode is removed by etching said third silicon oxide film under conditions with a low ratio of selectivity relative to said silicon nitride film,
wherein a sum of an opening area at said third silicon oxide film and an area over which a resist is removed from a peripheral area of said silicon substrate is kept at a constant value by removing the resist at the peripheral area of said silicon substrate prior to the first etching process.

8. The method for manufacturing a self alignment contact in a semiconductor device according to claim 7, wherein flow rates of components of the first etching gas mixture during said first etching process are $CF_4$: 60 sccm, Ar: 160 sccm and $O_2$: 60 sccm.

9. The method for manufacturing a self alignment contact in a semiconductor device according to claim 7, wherein said third silicon oxide film is over etched by approximately 15% relative to a desired etching depth achieved during said third etching process.

10. The method for manufacturing a self alignment contact in a semiconductor device according to claim 7, wherein the second etching gas mixture includes $C_4F_8$, argon and $CH_2F_2$.

11. The method for manufacturing a self alignment contact in a semiconductor device according to claim 10, wherein flow rates of components of the second etching gas mixture during said second etching process are $C_4F_8$: 10 sccm, Ar: 500 sccm and $CH_2F_2$: 4 sccm.

12. The method for manufacturing a self alignment contact in a semiconductor device according to claim 7, wherein said third etching process uses a third etching gas mixture that includes $C_4F_8$, argon and $CH_2F_2$.

13. The method for manufacturing a self alignment contact in a semiconductor device according to claim 12, wherein flow rates of components of the third etching gas mixture during said third etching process are $C_4F_8$: 8 sccm or less, Ar: 500 sccm and $CH_2F_2$: 4 sccm.

14. The method for manufacturing a self alignment contact in a semiconductor device according to claim 7, wherein the second etching gas mixture and a third etching gas mixture used during said third etching process both include $C_4F_8$, argon and $CH_2F_2$, wherein a flow rate of $C_4F_8$ in the second etching gas mixture is greater than a flow rate of $C_4F_8$ in the third etching gas mixture.

15. The method for manufacturing a self alignment contact in a semiconductor device according to claim 7, wherein a distance between said first electrode and said second electrode is 220 nm.

* * * * *